United States Patent [19]

Suzuki

[11] Patent Number: 5,497,020
[45] Date of Patent: Mar. 5, 1996

[54] CHARGE DRAIN FOR A MIS DEVICE

[75] Inventor: Junya Suzuki, Kanagawa, Japan

[73] Assignee: Sony Corporation, Tokyo, Japan

[21] Appl. No.: 284,759

[22] Filed: Aug. 2, 1994

Related U.S. Application Data

[63] Continuation of Ser. No. 36,241, Mar. 24, 1993, abandoned.

[30] Foreign Application Priority Data

Mar. 25, 1992 [JP] Japan .................................. 4-098797

[51] Int. Cl.$^6$ .......................... H01L 23/62; H01L 27/148
[52] U.S. Cl. .......................... 257/356; 257/217; 257/249; 257/401
[58] Field of Search ..................... 257/215, 216, 257/217, 393, 249, 288, 368, 386, 401, 356

[56] References Cited

U.S. PATENT DOCUMENTS

| | | | |
|---|---|---|---|
| 3,781,574 | 12/1973 | White et al. | 257/215 |
| 3,969,744 | 7/1976 | Nicholas et al. | 257/393 |
| 4,432,073 | 2/1984 | Masuoka | 257/393 |

FOREIGN PATENT DOCUMENTS

| | | | |
|---|---|---|---|
| 2039499 | 2/1979 | Germany | 257/288 |
| 52-74286 | 6/1977 | Japan | 257/217 |
| 53-123681 | 10/1978 | Japan | 257/217 |
| 54-101294 | 8/1979 | Japan | 257/288 |
| 57-145375 | 9/1982 | Japan | 257/393 |
| 60-254773 | 12/1985 | Japan | 257/215 |
| 4-225532 | 8/1992 | Japan | 257/288 |

*Primary Examiner*—Ngân V. Ngô
*Attorney, Agent, or Firm*—Hill, Steadman & Simpson

[57] ABSTRACT

A semiconductor device which has a diffusion layer region in a semiconductor body, and a MIS transistor with a gate electrode formed on the semiconductor body that is connected to the diffusion layer region. The semiconductor device is made by the steps of forming a diffusion layer region in the upper layer of the semiconductor body forming a gate electrode on the upper surface of the semiconductor body through a gate insulating film which is connected to the diffusion layer region and forming source and drain regions on the upper layer of the semiconductor body on both sides of the gate electrode so that unnecessary electrical charges on the gate electrode of the MIS transistor and transfer electrodes of the CCD device are removed.

7 Claims, 7 Drawing Sheets

F I G . 1
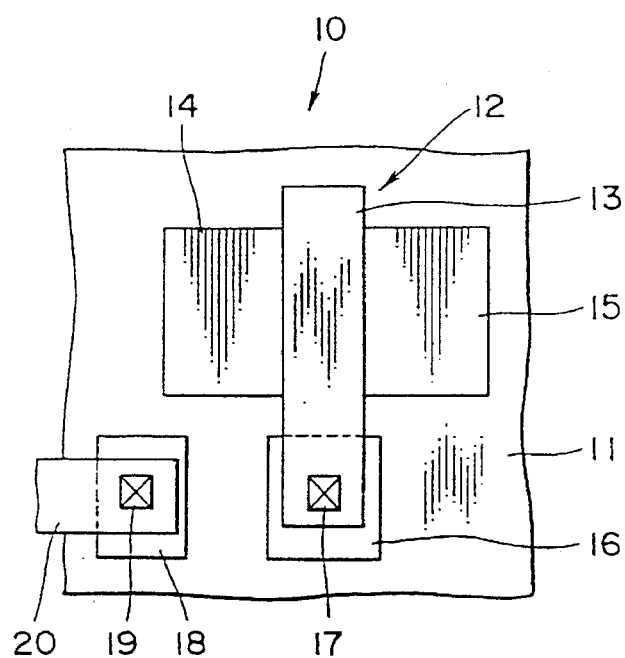
F I G . 2
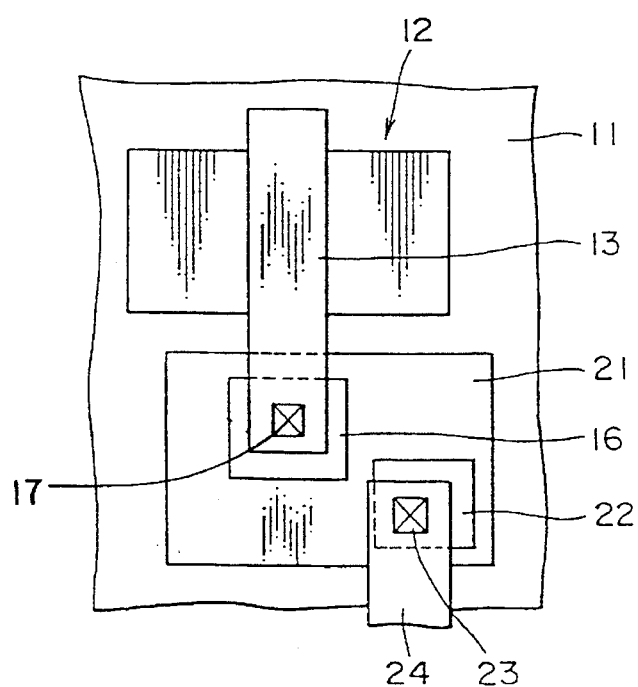

CHARGE DRAIN FOR A MIS DEVICE

This is a continuation of application Ser. No. 08/036,241, filed Mar. 24, 1993, now abandoned.

BACKGROUND OF THE INVENTION

1. Field of the Invention

The present invention relates to a semiconductor device having a MIS transistor, a CCD device or the like, and its fabrication method.

2. Description of the Related Art

The conventional MIS transistor includes a protective device for draining the charges on a gate electrode separately from the MIS transistor. For example, a diode is used as the protective device.

The above MIS transistor and the protective device are almost concurrently formed on a semiconductor body. Thus, in a wiring process (for example, metal wiring process) after formation of the MIS transistor and the protective device, the gate electrode of the MIS transistor is connected to the protective device by means of a wiring.

Also, the conventional CCD device does not include a protective device for draining the charges on each transfer electrode thereof.

In the MIS transistor of the above structure, the gate electrode is connected to the protective device by a wiring during the wiring process. Accordingly, in the process prior to the wiring process, the charge is stored on the film surface forming the gate electrode or the surface of the gate electrode with a treatment using plasma and ions (for example, a plasma etching treatment, reactive ion etching treatment, or ion implantation treatment). As a result, the gate electrode is charged up to several tens to several hundreds of volt, so that the threshold voltage Vth varies. Consequently, the operational margin of the MIS transistor is made smaller, thereby degrading the performance of the transistor.

To cope with the above problem, in a treatment using plasma and ions, an antistatic ion has been added in the reactive gas and the etching gas. However, this technique has the following disadvantages: namely, by the addition of the antistatic ion, it is possible to reduce the amount of the electrical charges on the gate electrode of the MIS transistor during the treatment using plasma and ions, and it is impossible to reduce the amount of the electrical charges to such a level as to eliminate the variation in the threshold voltage Vth. This makes it difficult to prevent the degradation in the performance of the MIS transistor due to the variation in the threshold voltage Vth.

Also, in the above CCD device, since the protective device is not connected to each transfer electrode, the transfer electrode is charged by the treatment using plasma and ions in the process of forming the transfer electrode and the subsequent process. As a result, the surface potential of the transfer electrode is varied, which causes malfunctions in transfer of the signal charge, thereby degrading the reliability of the CCD device.

SUMMARY OF THE INVENTION

Accordingly, an object of the present invention is to provide a semiconductor device for enhancing the reliability thereof by eliminating the influence of the charges.

To achieve the above object, according to the present invention, there is provided a semiconductor device comprising: an MIS transistor formed on a semiconductor body; and a diffusion layer region provided in a part of the upper layer of the semiconductor body which is connected to a gate electrode of the MIS transistor.

Also, in the present invention, there is provided a method of fabricating a semiconductor device having a MIS transistor comprising the steps of: forming a diffusion layer region in a part of the upper layer of a semiconductor body, before forming an electrode formation film or forming a gate electrode of the MIS transistor on the semiconductor body; forming the electrode formation film so it is connected to the diffusion layer region; and forming the gate electrode of the MIS transistor by means of the electrode formation film.

Further, in the present invention, there is provided a semiconductor device comprising: a CCD device having a plurality of transfer electrodes formed on a semiconductor body; and diffusion layer regions provided on a part of the upper layer of the semiconductor body which are respectively connected to a plurality of the transfer electrodes, or diffusion layer regions each connected to at least one of the connected transfer electrodes of a plurality of the transfer electrodes.

Still further, in the present invention, there is provided a method of fabricating a semiconductor device comprising the steps of: forming a plurality of diffusion layer regions in a part of the upper layer of a semiconductor body, before forming an electrode formation film; forming the electrode formation film which is respectively connected to the diffusion layer regions; forming a plurality of transfer electrodes by means of the electrode formation film which are respectively connected to the diffusion layer regions, or forming a plurality of transfer electrodes by means of the electrode formation film such that one of the diffusion layer regions is connected to at least one of the connected transfer electrodes.

In the semiconductor device having the MIS transistor described above, by formation of the diffusion layer region connected to the gate electrode, the electrical charges on the gate electrode escape to the diffusion layer region.

In the method of fabricating the semiconductor device having the MIS transistor described above, first, the diffusion layer region is formed in a part of the semiconductor body, after which the gate electrode of the MIS transistor connected to the diffusion layer region is formed. Accordingly, the electrical charges on the gate electrode escape to the diffusion layer region, so that the charge is not stored on the gate electrode during the fabrication processes.

In the semiconductor device having the CCD device described above, a plurality of transfer electrodes are all directly or indirectly connected to the diffusion regions, so that the electrical charges on each transfer electrode escape to the diffusion region.

In the method of fabricating the semiconductor device having the CCD device described above, first, the diffusion layer regions are formed in a part of the semiconductor body, after which the electrode formation film connected to the diffusion layer regions is formed, so that the electrical charges on the electrode formation film escape to the diffusion layer regions.

Also, in formation of the transfer electrodes, the transfer electrodes are all formed so as to be directly or indirectly connected to the diffusion layer regions, so that the electrical charges on the transfer electrodes escape to the diffusion layer regions.

Therefore, the charge is never stored on each transfer electrode.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 1 is a schematic diagram showing a layout of a first embodiment;

FIG. 2 is a schematic diagram showing a layout of a semiconductor device according to a first modification of the first embodiment;

DETAILED DESCRIPTION OF THE PREFERRED EMBODIMENTS

Figure 3:
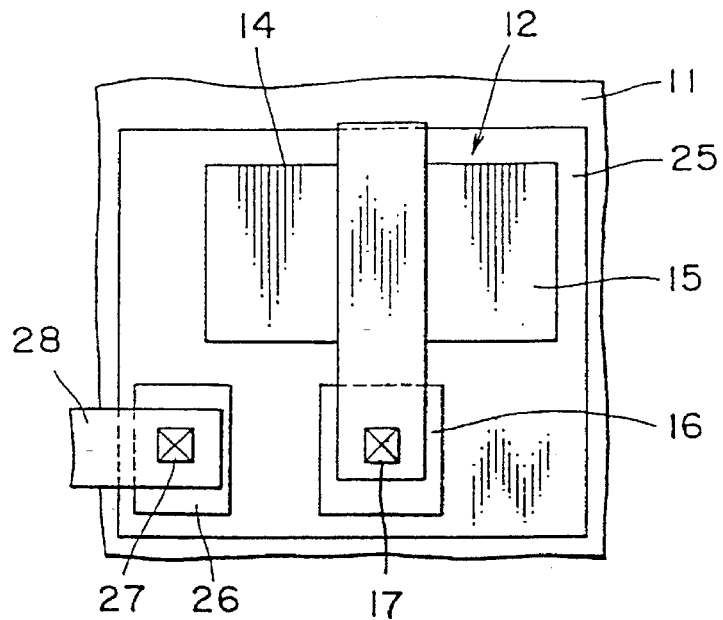
FIG. 3 is a schematic diagram showing a layout of a semiconductor device according to a second modification of the first embodiment.

Hereinafter, the preferred embodiments of the present invention will be described in detail with reference to the accompanying drawings.

EMBODIMENT 1

FIG. 1 is a schematic view showing the layout of a first embodiment of the present invention.

As shown in this figure, an MIS transistor 12 is formed on a semiconductor body 11.

The MIS transistor 12 comprises a gate electrode 13 provided on the upper surface of the semiconductor body 11 through a gate insulating film (not shown), and source and drain regions 14 and 15 formed in the upper layer of the semiconductor body 11 on both sides of the gate electrode 13.

A diffusion layer region 16 is formed in the upper layer of the semiconductor body 11 which is not connected to the source and drain regions 14 and 15. The diffusion layer region 16 is formed of a diffusion layer doped with a conductive impurity with a high concentration.

Further, an insulating film (not shown) is formed on the upper surface of the semiconductor body 11, except for the portions forming the gate electrode 13 and the source and drain regions 14 and 15.

A contact hole 17 is formed in the insulating film on the diffusion layer region 16. The gate electrode 13 is connected to the diffusion layer region 16 through the contact hole 17.

Also, in the case that the gate electrode 13 is made of a polycrystalline silicon doped with a conductive impurity, the gate electrode 13 and the diffusion layer region 16 are formed so as to be of the same conductivity type.

As described above, there is formed a semiconductor device 10 comprising the MIS transistor 12 and the diffusion layer region 16.

In the semiconductor device 10 having the above structure, since the gate electrode 13 is connected to the diffusion layer region 16, the electrical charges on the gate electrode 13 escape to the diffusion layer region 16. Accordingly, the charge is not stored on the gate electrode 13.

In the above semiconductor device 10, for example, the semiconductor body 11 is made of a silicon body of a first conductivity type, and the channel of the MIS transistor 12 is formed of the first conductivity type. Also, the diffusion layer region 16 is formed of a high concentration diffusion layer of a second conductivity type. In such a construction, by formation of the diffusion layer region 16 with a width similar to or smaller than that of the gate electrode 13, it is possible to minimize the formation area of the diffusion layer region 16 with respect to the semiconductor body 11.

Also, for connection of the diffusion layer region 16 to the ground (not shown), a high concentration diffusion region 18 of the first conductivity type is formed in the upper layer of the semiconductor body 11 which is not connected to the source and drain regions 14 and 15, and the diffusion layer region 16.

Thus, one end side of a wiring 20 is connected to the high concentration diffusion region 18 through a contact hole 19 provided in an insulating film (not shown) to the high concentration diffusion region 18, whereas the other end side of the wiring 20 is connected to the ground (not shown).

Also, as shown in FIG. 2, the semiconductor body 11 is made of a silicon body of the first conductivity type, and the MIS transistor 12 is formed of an MOS transistor having the channel of the first conductivity type, and further, the diffusion layer region 16 connected to the gate electrode 13 of the MIS transistor 12 is formed of, for example a diffusion layer of the first conductivity type. In this case, the diffusion layer region 16 is formed in the upper layer of a well region 21 of the second conductivity type formed in the upper layer of the semiconductor body 11.

For connection of the diffusion layer region 16 having the above structure to the ground (not shown), a high concentration diffusion region 22 of the second conductivity type is formed in the well region 21. Further, one end side of a wiring 24 is connected to the high concentration diffusion region 22 through a contact hole 23 provided on an insulating film (not shown) on the high concentration diffusion region 22, whereas the other end side of the wiring 24 is connected to the ground (not shown).

As shown in FIG. 3, in the case that the semiconductor body 11 is made of a silicon body of the first conductivity type and the MIS transistor 12 is formed of an MOS transistor having the channel of the second conductivity type, the MIS transistor 12 is formed in the upper layer of a well region 25 of the second conductivity type formed in the upper layer of the semiconductor body 11. Also, in the case that the diffusion layer region 16 is formed of, for example a diffusion layer of the first conductivity type, the diffusion layer region 16 is formed in the upper layer of the well region 25 which is not connected to the source and drain regions 14 and 15.

For connection of the diffusion layer region 16 having the above structure to the ground (not shown), a high concentration diffusion region 26 of the second conductivity type is formed in the upper layer of the well region 25 at a position which is not connected to the source and drain regions 14 and 15 and the diffusion layer region 16. Further, one end side of a wiring 28 is connected to the high concentration diffusion region 26 through a contact hole 27 provided on an insulating film (not shown) on the high concentration diffusion region 26, whereas the other end side of the wiring 28 is connected to the ground (not shown).

Figure 4:
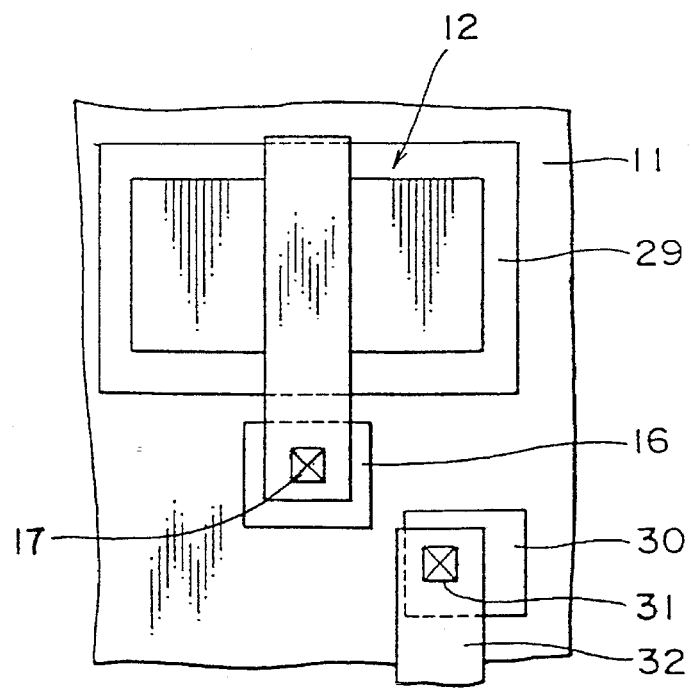
FIG. 4 is a schematic diagram showing a layout of a semiconductor device according to a third modification of the first embodiment.
Figure 5A:
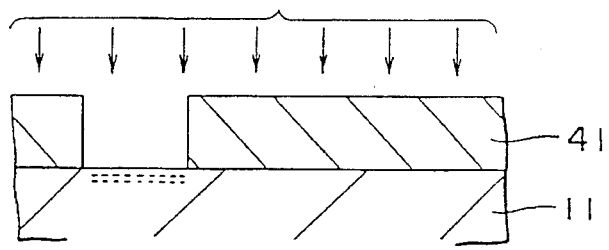
FIGS. 5(1) to 5(4) are a flow diagram showing fabrication processes of the first embodiment.
Figure 5B:
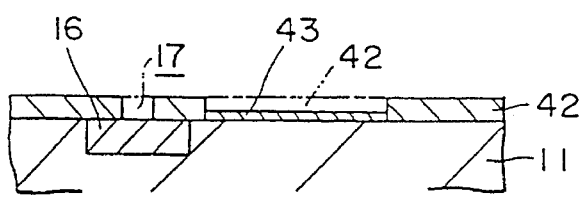
Figure 5C:
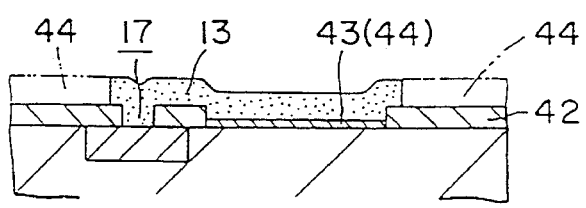
Figure 5D:
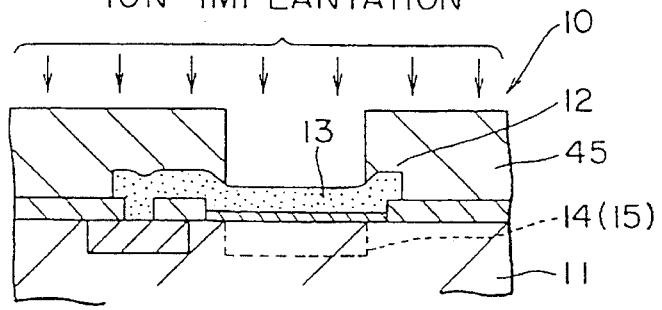

As shown in FIG. 4, in the case that the semiconductor body 11 is made of a silicon body of the first conductivity type and the MIS transistor 12 is formed of an MOS transistor having the channel of the second conductivity type, the MIS transistor 12 is formed in a well region 29 of the second conductivity type formed in the upper layer of the semiconductor body 11. Also, in the case that the diffusion layer region 16 is formed of, for example a diffusion layer of the second conductivity type, the diffusion layer region 16 is formed in the upper layer of the semiconductor body 11 which is not connected to the well region 29.

For connection of the diffusion layer region 16 having the above structure to the ground (not shown), a high concentration diffusion region 30 of the first conductivity type is formed in the upper layer of the semiconductor body 11 which is not connected to the well region 29 and the diffusion layer region 16. Further, one end side of a wiring 32 is connected to the high concentration diffusion region 30 through a contact hole 31 provided on an insulating film (not shown) on the high concentration diffusion region 30, whereas the other end side of the wiring 32 is connected to the ground (not shown).

Next, a method of fabricating the semiconductor device 10 shown in FIG. 1 will be described with reference to a flow diagram of fabrication processes in FIGS. 5(1) to 5(4).

As shown in a first process in FIG. 5(1), an ion implantation mask 41 is formed on the upper layer of a semiconductor body 11 by the usual photolithography technique. Subsequently, ions of a conductive impurity are implanted in the upper layer of the semiconductor body 11 by the usual ion implantation method using the above ion implantation mask 41.

After that, the above ion implantation mask 41 is removed, for example, by the asher treatment.

As shown in a second process in FIG. 5(2), an insulating film 42 is formed on the upper surface of the semiconductor body 11, for example, by the usual chemical vapor deposition method.

After that, the insulating film 42 a the formation area of the MIS transistor 12 (portion shown as two-dot chain line) is formed by the usual photolithography and etching.

A gate insulating film 43 is formed on the surface of the semiconductor body 11, for example, by the usual thermal oxidation method.

After heat treatment, a conductive impurity doped in the upper layer of the semiconductor body 11 is diffused, to form the diffusion layer region 16 in the upper layer of the semiconductor body 11.

Then, by the usual photolithography and etching, the portion shown as a chain line of the insulating film 42 on the diffusion layer region 16 is removed, to form the contact hole 17.

In addition, the above diffusion layer region 16 may be formed in such a manner that, after formation of the insulating film 42 or the gate insulating film 43, the conductive impurity is doped in a part of the upper layer of the semiconductor body 11. In the case that the ion implantation is made after formation of the gate insulating film 43, a diffusion treatment is required to diffuse the conductive impurity doped into the semiconductor body 11.

As shown in a third process of FIG. 5(3), an electrode formation film 44 is formed on the upper surfaces of the insulating film 42 and the gate insulating film 43, and on the internal portion of the contact hole 17.

Then, by the usual photolithography and etching, the portions shown by the two-dot chain line of the electrode formation film 44 are removed, to form the gate electrode 13.

Next, as shown in a fourth process of FIG. 5(4), a resist mask 45 is formed on the upper layer of the semiconductor body 11. Subsequently, ions of a conductive impurity are implanted in the upper layer of the semiconductor body 11 on both sides of the gate electrode 13 by the usual ion implantation method using the resist mask 45 and the gate electrode 13 as the ion implantation mask. After that, the implanted conductive impurity is diffused in the upper layer of the semiconductor body 11, to form a source (drain) region 14 (15) (shown as broken lines).

Thus, there is formed the semiconductor device 10 having the MIS transistor 12, wherein the gate electrode 13 is connected to the diffusion layer region 16.

According to the method of fabricating the semiconductor device 10 having the MIS transistor 12 described above, during the fabricating processes, the electrical on the electrode formation film 44 or the gate electrode 13 are allowed to flow to the diffusion layer region 16. Accordingly, the charge is not stored on the surface of the electrode formation film 44 or the gate electrode 13 during the fabrication processes. Consequently, the threshold voltage Vth of the MIS transistor 12 formed according to the above fabrication method is held to a designed value.

EMBODIMENT 2

Figure 6:
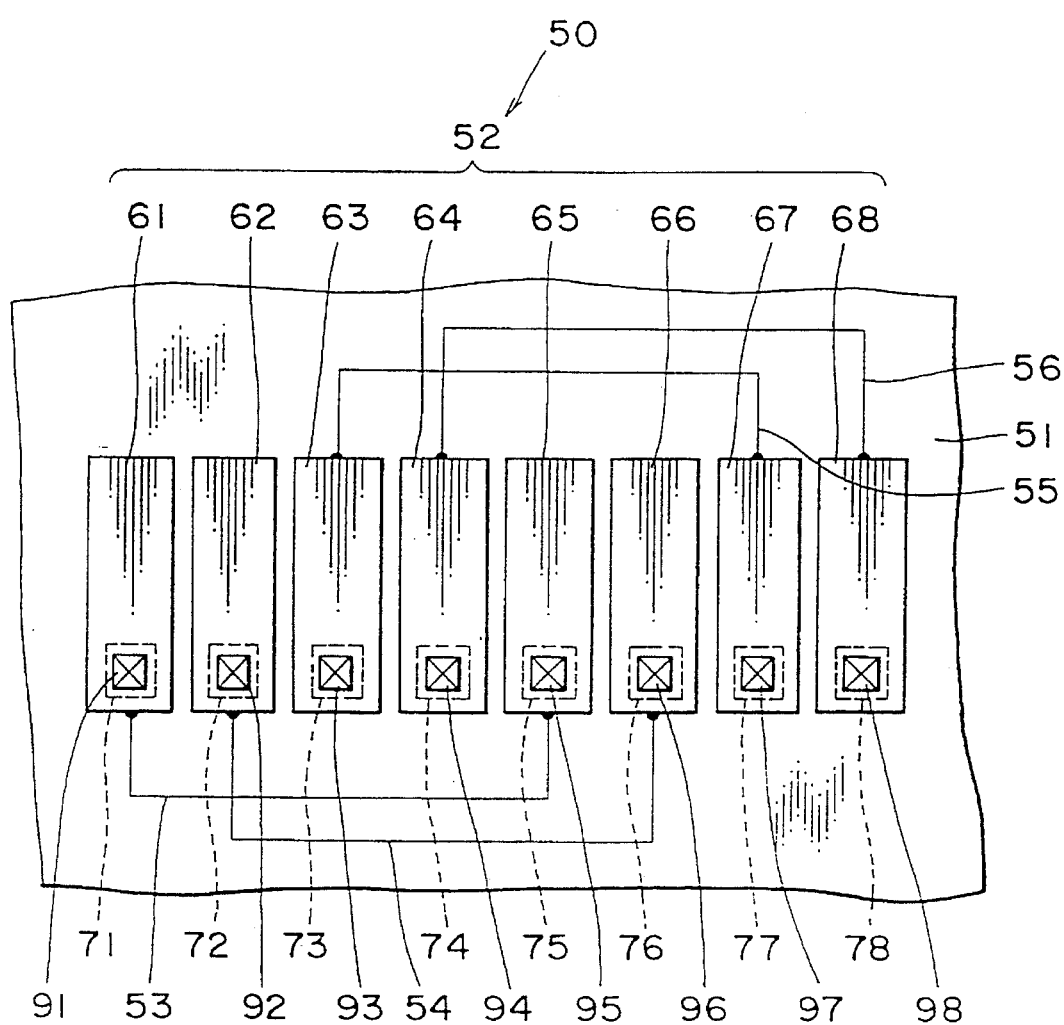
FIG. 6 is a schematic diagram showing a layout of a second embodiment.

Next, as a second embodiment, there will be described a semiconductor having a CCD device of a single layer electrode structure for trasferring the charge with the clock pulse having four-phases with reference to the schematic layout diagram of FIG. 6.

As shown in this figure, a CCD device having a single layer electrode structure is formed on a semiconductor body 51.

The above CCD device comprises an insulating layer (not shown) formed on the upper surface of the semiconductor body 51, and a plurality of transfer electrodes 61 to 68 formed on the upper surface of the insulating layer. In this figure, the light receiving portions of the CCD device are omitted.

The transfer electrodes 61 and 65 are connected to each other by means of a wiring 53, and the transfer electrodes 62 and 66 are connected to each other by means of a wiring 54. Also, the transfer electrodes 63 and 67 are connected to each other by means of a wiring 55, and the transfer electrodes 64 and 68 are connected to each other by means of a wiring 56.

In the upper layer of the above semiconductor body 51, diffusion layer regions 71 to 78 connected to the transfer electrodes 61 to 68 are formed through contact holes 91 to 98, respectively.

The diffusion layer regions 71 to 78 are connected to the ground (not shown) through ground wirings (not shown).

As described above, there is formed a semiconductor device 50 comprising the CCD device 52 and the diffusion layer regions 71 to 78.

In the semiconductor device 50 described above, the transfer electrodes 61 to 68 are connected to the diffusion layer regions 71 to 78, respectively, so that the electrical charges on the transfer electrodes 61 to 68 are allowed to flow to the diffusion layer regions 71 to 78, respectively. The above charges are allowed to further flow from the diffusion layer regions 71 to 78 to the ground (not shown) through the ground wirings (not shown). As a result, the surface potential on the CCD device is not varied by the electrical charges. Consequently, the threshold voltage Vth of the transfer electrodes 61 to 68 is not varied, thus eliminating the malfunction in transfer of the signal charge.

The CCD device 52 mounted on the semiconductor device 50 described above is of a type for transferring the charge with the clock pulse having four-phases; however, the above description is true for the CCD device for transferring the charge with the clock pulse of two-phase or three-phase. Namely, by provision of the diffusion layer region to each transfer electrode, the surface potential of the CCD device is prevented from being varied by the electrical charge.

Next, one form of a method of fabricating the above semiconductor device 50 will be described with reference to the flow diagram of fabrication processes of FIGS. 7(1) to 7(3).

Figure 7A:
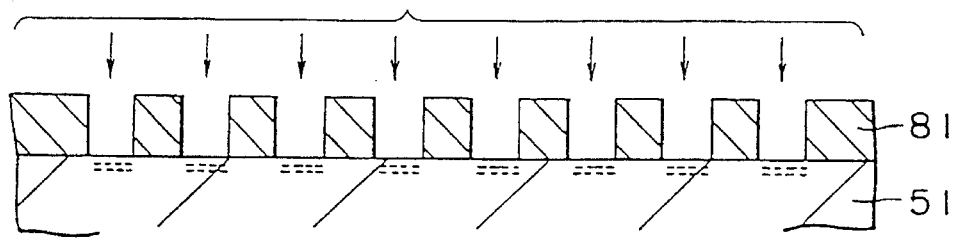
FIGS. 7(1) to 7(3) are a flow diagram showing fabrication processes of the second embodiment.
Figure 7B:
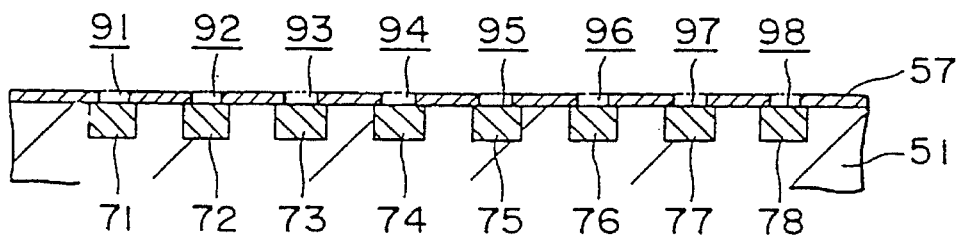
Figure 7C:
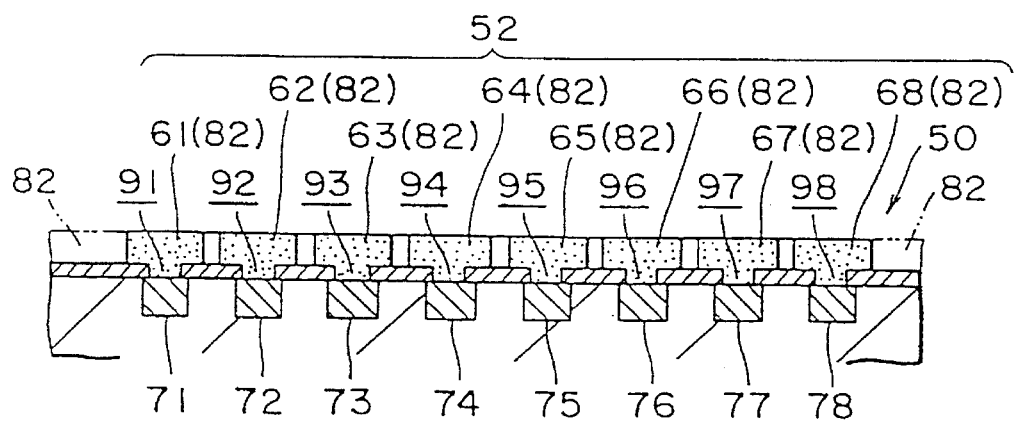
Figure 10A:
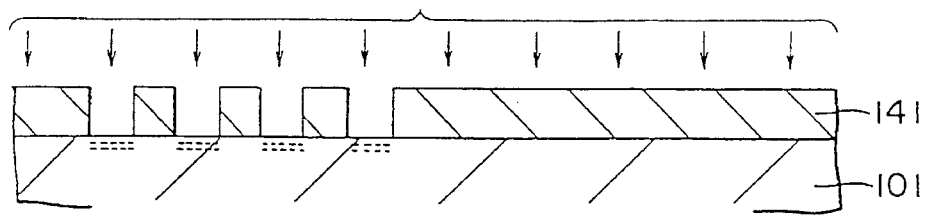
FIGS. 10(1) to 10(4) are a flow diagram showing fabrication processes of the third embodiment.
Figure 10B:
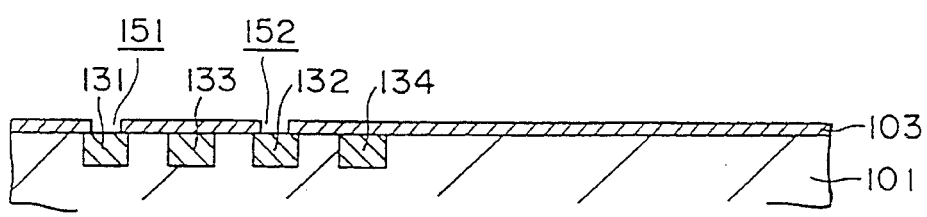
Figure 10C:
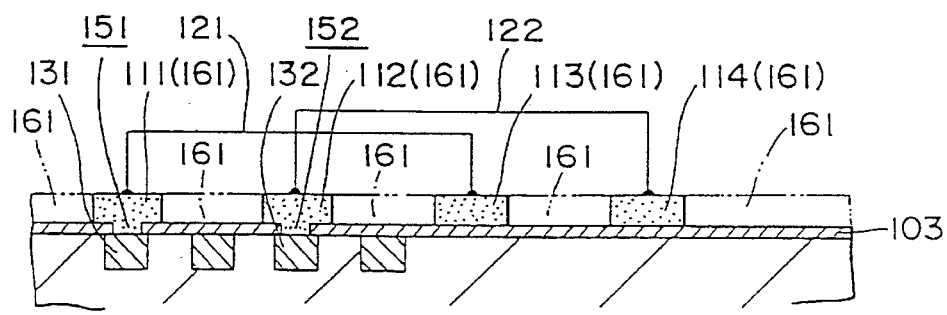
Figure 10D:
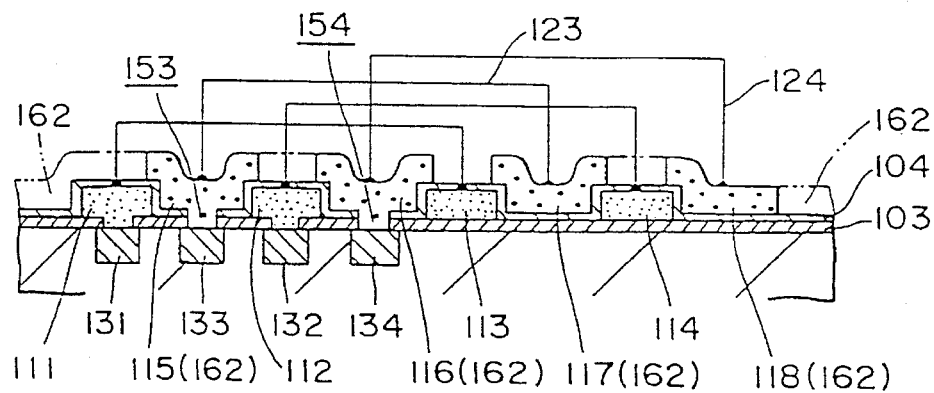

As shown in a first process of FIG. 7(1), an ion implantation mask 81 is formed on the upper layer of the semiconductor body 51 by the usual photolithography technique. Then, ions of a conductive impurity are implanted in the upper layer of the semiconductor body 51 by the usual ion implantation method using the above ion implantation mask 81.

After that, the ion implantation mask 81 is removed, for example, by the asher treatment.

Next, as a second process of FIG. 7(2), an insulating film 57 is formed on the surface of the semiconductor body 51, for example, by the usual thermal oxidation method.

During heat treatment, the conductive impurity doped in the upper layer of the semiconductor body 51 is diffused, to form the diffusion layer regions 71 to 78 in the upper layer of the semiconductor body 51.

Subsequently, by the usual photolithography and etching, the portions shown as the two-dot chain line on respective diffusion layer regions 71 to 78 are removed, to form the contact holes 91 to 98.

In addition, the above diffusion layer regions 71 to 78 may be formed in such a manner that, after formation of the insulating layer 57, the conductive impurity is doped in a part of the upper layer of the semiconductor body 51, for example, by the usual ion implantation method. In the case that the ion implantation is made after formation of the insulating layer 57, a diffusion treatment is required to diffuse the conductive-impurity doped in the semiconductor body 51.

As shown in a third process of FIG. 7(3), an electrode formation film 82 is formed on the upper surface of the insulating layer 57 and on the internal portions of the contact holes 91 to 98 by the usual chemical vapor deposition.

The portions shown as the two-dot line of the above electrode formation film 82 are removed by the usual photolithography and etching, to form the transfer electrodes 61 to 68 connected to the diffusion layer regions 71 to 78 through the contact holes 91 to 98, respectively.

After that, a second insulating film (not shown) is formed to cover respective transfer electrodes 61 to 68.

Subsequently, by the usual wiring formation technique, the specified transfer electrodes of respective transfer electrodes 61 to 68 are connected to each other by means of wirings (not shown).

As described above, there is formed the semiconductor device 50 having the CCD device 52 of the single layer electrode structure.

According to the method of fabricating the semiconductor device 50 as described above, during the processes of forming the transfer electrodes 61 to 68, or after formation of the transfer electrodes 61 to 68, the electrical charges on the surfaces of the transfer electrodes 61 to 68 are allowed to flow to the diffusion layer regions 71 to 78, respectively. Accordingly, the charge is not stored on the surface of the transfer electrodes 61 to 68. As a result, the surface potential of the CCD device 52 is prevented from being varied, thereby eliminating malfunction during transfer of the signal charge.

EMBODIMENT 3

Figure 8:
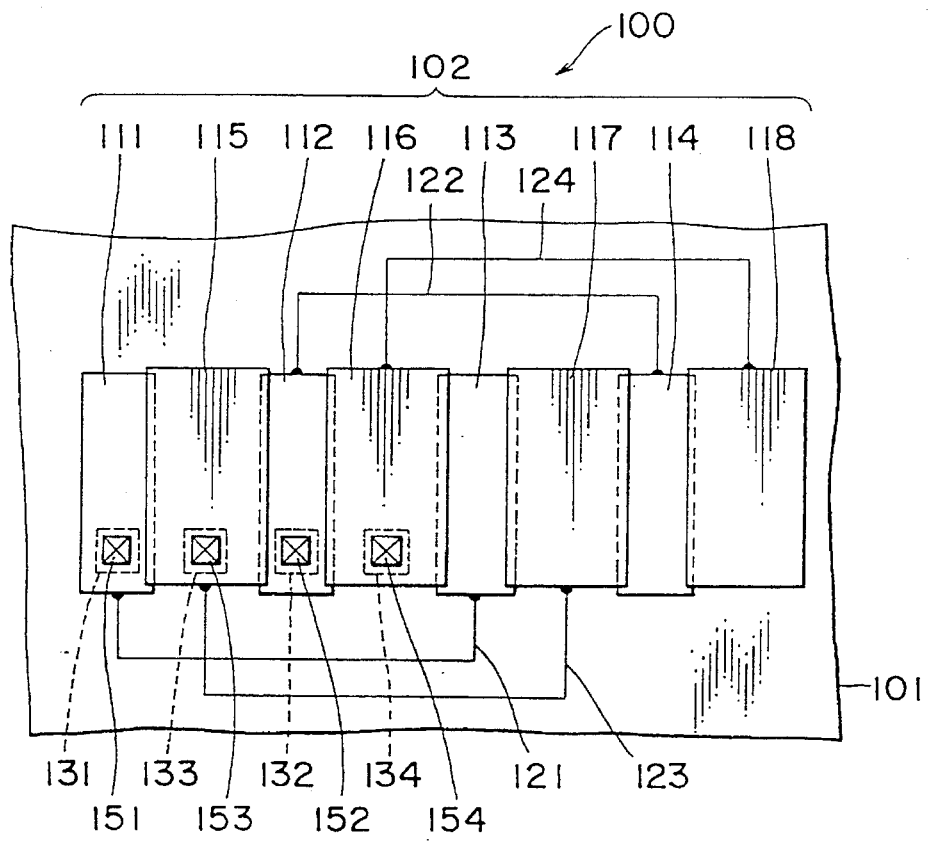
FIG. 8 is a schematic diagram showing a layout of a third embodiment.
Figure 9:
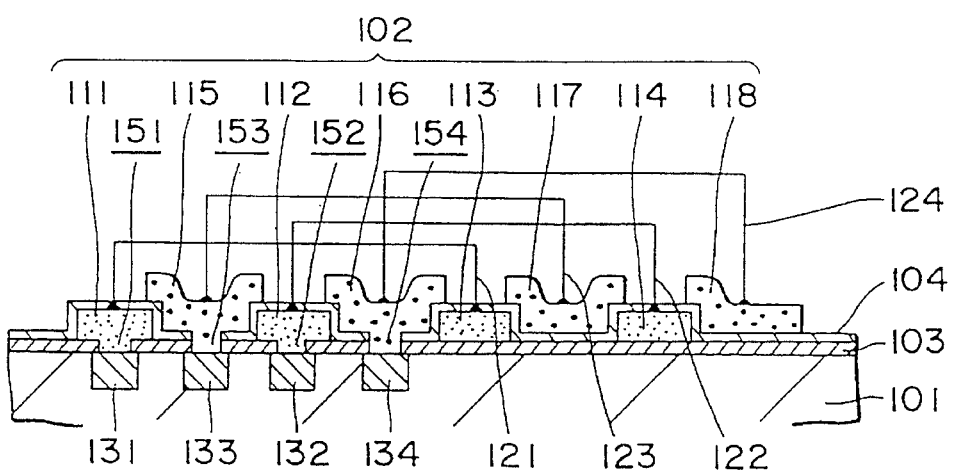
FIG. 9 is a schematic sectional view showing the construction of the third embodiment.

Next, as a third embodiment, there will be described a semiconductor device having a CCD device of a plural layer overlapping electrode structure with reference to a schematic layout diagram of FIG. 8 and a schematic sectional construction view of FIG. 9.

As shown, on a semiconductor body 101, there is formed a CCD device 102 having an electrode structure made of, for example two layers of polycrystalline silicon for transferring the charge with clock pulses having four-phases. Incidentally, in this figure, the light receiving portions of the CCD device 102 are omitted.

The above CCD device 102 comprises an insulating layer 103 formed on the upper surface of the semiconductor body 101; a plurality of first transfer electrodes 111 to 114 composed of a first electrode formation film formed on the upper surface of the insulating layer 103; an insulating film 104 formed to cover the first transfer electrodes 111 to 114; and a plurality of second transfer electrodes 115 to 118 composed of a second layer electrode formation film formed on the upper surfaces of the above insulating layers 103 and 104.

The transfer electrodes 111 and 113 are connected to each other by a first wiring 121, and the first transfer electrodes 112 and 114 are connected to each other by means of a second wiring 122. Further, the second transfer electrodes 115 and 117 are connected to each other by means of a third wiring 123, and the second transfer electrodes 116 and 118 are connected to each other by means of a fourth wiring 124. The above second transfer electrodes 115 to 118 are formed so as to overlap on the first transfer electrodes 111 to 114, respectively.

Also, diffusion layer regions 131 to 134 are formed in the upper layer of the above semiconductor body 101.

The above first transfer electrodes 111 and 113, for example, the first transfer electrode 111 is connected to the diffusion layer region 131 through a first contact hole 151 formed on the insulating layer 103. The first transfer electrodes 112 and 114, for example, the first transfer electrode 112 is connected to the diffusion layer region 132 through a first contact hole 152 formed on the insulating layer 103. Also, the second transfer electrodes 115 and 117, for example, the second transfer electrode 115 is connected to the diffusion layer 133 through a second contact hole 153 formed on the insulating layers 103 and 104. Further, the second transfer electrodes 116 and 118, for example, the second transfer electrode 116 is connected to the diffusion layer region 134 through a second contact hole 154 formed on the insulating layers 103 and 104.

The diffusion layer regions 131 to 134 are connected to the ground (not shown) by means of wirings (not shown), respectively.

As described above, there is formed a semiconductor device 100 comprising the CCD device 102 and the diffusion layer regions 131 to 134.

In the semiconductor device 100 described above, the diffusion layer region 131 is connected to the first transfer electrode 111 of the first transfer electrodes 111 and 113 formed of the same electrode formation film, so that the electrical on the first transfer electrodes 111 and 113 formed of the same electrode formation film are allowed to flow from the first transfer electrode 111 to the diffusion layer region 131, and further, to the ground (not shown) through a wiring (not shown). Similarly, the electrical on the first transfer electrodes 112 and 114, and on the second transfer electrodes 115 to 118 are allowed to flow to the diffusion layer region 132 and 134, respectively.

Consequently, the surface potential of the CCD device 102 is not varied due to charges which eliminates malfunctions during transfer of the signal charge.

Next, the method of fabricating the semiconductor device 100 will be described with reference to a flow diagram of fabrication processes of FIGS. 10(1) to 10(4).

As shown in a first process of FIG. 10(1), an ion implantation mask 141 is formed on the upper layer of the semiconductor body 101 by the usual photolithography technique. Subsequently, ions of a conductive impurity are implanted in the upper layer of the semiconductor body 101 by the usual ion implantation method using the above ion implantation mask 141.

After that, the ion implantation mask 141 is removed, for example, by the asher treatment.

Next, as a second process of FIG. 10(2), the insulating film 103 is formed on the surface of the semiconductor body 101, for example, by the usual thermal oxidation method.

During this heat treatment, the conductive impurity doped in the upper layer of the semiconductor body 101 is diffused, to form the diffusion layer regions 131 to 134 in the upper layer of the semiconductor body 101.

In addition, the above diffusion layer regions 131 to 134 may be formed in such a manner that, after formation of the insulating layer 103, the conductive impurity is doped in a part of the upper layer of the semiconductor body 101, for example, by the usual ion implantation method. In this case, a diffusion treatment is required to diffuse the conductive impurity doped in the semiconductor body 101 to form the diffusion layer regions 131 to 134.

Then, by the usual photolithography and etching, the first contact holes 151 and 152 are formed on the insulating layer 103 on the diffusion layer regions 131 and 132.

As shown in a third process of FIG. 10(3), a first layer electrode formation film 161 is formed on the upper surface of the insulating layer 103 and on the internal portions of the first contact holes 151 to 152 by the usual chemical vapor deposition.

The portions shown as the two-dot line of the above first layer electrode formation film 161 are removed by the usual photolithography and etching, to form a plurality of transfer electrodes 111 to 114. The first transfer electrode 111 of the first transfer electrodes 111 to 114 is connected to the diffusion layer region 131 through the first contact hole 151. Also, the transfer electrode 112 of a plurality of the transfer electrodes 111 to 114 is connected to the diffusion layer region 132 through the first contact hole 152.

In addition, the first transfer electrodes 111 and 113 are connected to each other by means of the wiring 121 formed of the first layer electrode formation film 161, and the first transfer electrodes 112 and 114 are connected to each other by means of the wiring 122 formed of the first layer electrode formation film 161.

As shown in FIG. 10(4), the insulating film 104 is formed to cover the first transfer electrodes 111 to 114, for example, by the usual thermal oxidation method. The insulating film 104 is also formed on the insulating layer 103.

After that, by the usual photolithography and etching, the second contact holes 153 and 154 are formed on the insulating layers 103 and 104 on the diffusion layer regions 133 and 134, respectively.

Then, by the usual chemical vapor deposition, a second layer electrode formation film 162 is formed on the upper surface of the insulating film 104 and on the internal portions of the second contact holes 153 and 154.

After that, by the usual photolithography and etching, the portions shown as the two-dot chain line of the second layer electrode formation film 162 is removed, and a plurality of second transfer electrodes 115 to 118 are formed between the first transfer electrodes 111 to 114 so as to overlap on the first transfer electrodes 111 to 114, respectively. The transfer electrode 115 of a plurality of the second transfer electrodes 115 to 118 is connected to the diffusion layer region 133 through the second contact hole 153. Also, the transfer electrode 116 of a plurality of the second transfer electrodes 115 to 118 is connected to the diffusion layer region 134 through the second contact hole 154.

In addition, the second transfer electrodes 115 and 117 are connected to each other by means of the wiring 123 formed of the second layer electrode formation film 162. Also, the second transfer electrodes 116 and 118 are connected to each other by means of the wiring 124 formed of the second layer electrode formation film 162.

In the method of fabricating the semiconductor device 100 described above, during formation of the first layer electrode formation film 161, the first transfer electrodes 111 to 114 are connected to the diffusion layer regions 131 and 132. Also, during formation of the second layer electrode formation film 162, the second transfer electrodes 115 to 118 are connected to the diffusion layer regions 133 and 134. Accordingly, during the fabrication processes after formation of the first electrode formation film 161, the electrical charges on the first transfer electrodes 111 to 114 escape to the diffusion layer regions 131 and 132. Also, during the fabrication processes after formation of the second electrode formation film 162, the electrical charges on the second transfer electrodes 115 to 118 escape to the diffusion layer regions 133 and 134. Accordingly, during the fabrication processes, the charges are not stored on the first and second transfer electrodes 111 to 118. As a result, the surface potential of the CCD device is not varied during the processes, to which eliminates malfunction during transfer of the signal charge.

The inventions in the first and second embodiments can be applied to a vertical/horizontal transfer CCD of an inter-line transfer type two-dimensional solid camera tube, a transfer unit of a linear image sensor, a CCD delay line and the like.

As described above, in the present invention, the gate electrode of the MIS transistor is formed to be connected to the diffusion layer region. Accordingly, it is possible for the electrical charges to escape from the gate electrode to the diffusion layer region. This makes it possible to eliminate variations in the threshold voltage of the MIS transistor, and to improve the reliability of the MIS transistor.

Also, according to the present invention, the diffusion layer region is formed in the semiconductor body, after which the electrode formation film connected to the diffusion layer region is formed, and the gate electrode connected to the diffusion layer region is formed. Accordingly, it is possible for the electrical charges on the electrode formation film or the gate electrode to flow to the diffusion layer region during the fabrication processes. Thus, during the fabrication processes, the unnecessary charge is not stored on the electrode formation film or the gate electrode, thereby making it possible to improve the reliability of the MIS transistor which is to be formed.

Further, in the present invention, a plurality of transfer electrodes of the CCD device are directly or indirectly connected to the diffusion layer regions, respectively, so that the electrical charges on each transfer electrode escapes to the diffusion layer region. Consequently, the surface potential of the CCD device is prevented from being varied, thereby eliminating the malfunction of the CCD device.

Still further, in the present invention, the diffusion layer regions are formed on the semiconductor body, after which the electrode formation film connected to the diffusion layer regions is formed, and the transfer electrodes are formed. Accordingly, during the fabrication processes, the electrical on the electrode formation film or each transfer electrode is allowed to flow to the diffusion layer region. Consequently, during the fabrication processes, the charge is not stored on the transfer electrode, the surface potential of the CCD device to be formed is not varied. Therefore, it is possible to improve the reliability of the CCD device.

What is claimed is:

1. A semiconductor device having a MIS structure which comprises a semiconductor body, an insulating layer over a surface of said semiconductor body, and a gate electrode on said insulating layer formed over an active area, said semiconductor device comprising:

a charge draining region formed on said semiconductor body which has a portion remote from said active area, wherein said gate electrode extends to said portion of said charge draining region and is directly connected thereto so as to drain charges from said gate electrode and a high concentration region formed in an upper layer of said semiconductor body and a conductor with one end connected to ground potential and the other end connected to said high concentration region.

2. A semiconductor device according to claim 1 wherein said semiconductor body is of a first conductivity type and said charge draining region comprises a semiconductor region of a second conductivity type.

3. A semiconductor device according to claim 1 wherein said MIS structure constitutes a charge transfer device which has a plurality of closely spaced gate electrodes on said insulating layer being adjacent to and insulated from each other.

4. A semiconductor device according to claim 3 wherein said gate electrodes are made of polycrystalline silicon of the second conductivity type.

5. A semiconductor device according to claim 1 wherein said MIS structure constitutes a MIS transistor.

6. A semiconductor device according to claim 2, wherein said gate electrode is made of polycrystalline silicon of a second conductivity type.

7. A semiconductor device according to claim 1, wherein said semiconductor body is connected to a voltage source.

* * * * *